US009464163B2

United States Patent
Nakatsuji et al.

(10) Patent No.: US 9,464,163 B2
(45) Date of Patent: *Oct. 11, 2016

(54) NOVOLAK RESIN CONTAINING HEXAFLUOROISOPROPANOL GROUP, METHOD FOR PRODUCING SAME, AND COMPOSITION OF SAME

(71) Applicant: Central Glass Company, Limited, Ube-shi, Yamaguchi (JP)

(72) Inventors: Junya Nakatsuji, Fujimino (JP); Kazuhiro Yamanaka, Tachikawa (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/655,161

(22) PCT Filed: Dec. 25, 2013

(86) PCT No.: PCT/JP2013/084739
§ 371 (c)(1),
(2) Date: Jun. 24, 2015

(87) PCT Pub. No.: WO2014/104126
PCT Pub. Date: Jul. 3, 2014

(65) Prior Publication Data
US 2015/0337077 A1    Nov. 26, 2015

(30) Foreign Application Priority Data

Dec. 26, 2012  (JP) ................................ 2012-283413
Dec. 25, 2013  (JP) ................................ 2013-266476

(51) Int. Cl.
| | |
|---|---|
| C08G 8/04 | (2006.01) |
| C08G 14/02 | (2006.01) |
| C08L 63/00 | (2006.01) |
| C08G 61/12 | (2006.01) |
| C09D 163/00 | (2006.01) |
| C08G 59/62 | (2006.01) |
| C08G 8/14 | (2006.01) |
| G03F 7/004 | (2006.01) |
| G03F 7/038 | (2006.01) |
| C08G 16/02 | (2006.01) |
| C09D 161/00 | (2006.01) |
| C09D 161/06 | (2006.01) |
| C08L 61/00 | (2006.01) |

(Continued)

(52) U.S. Cl.
CPC .............. *C08G 61/128* (2013.01); *C08G 8/14* (2013.01); *C08G 16/0225* (2013.01); *C08G 59/62* (2013.01); *C08L 61/00* (2013.01); *C08L 61/06* (2013.01); *C09D 161/00* (2013.01); *C09D 161/06* (2013.01); *C09D 163/00* (2013.01); *G03F 7/0046* (2013.01); *G03F 7/038* (2013.01); *H05K 3/287* (2013.01)

(58) Field of Classification Search
CPC ..................................................... C09D 163/00
USPC ......................................................... 523/400
See application file for complete search history.

(56) References Cited

U.S. PATENT DOCUMENTS

| | | | |
|---|---|---|---|
| 3,496,239 A | * | 2/1970 | Venuto ................... B01J 29/082 |
| | | | 502/65 |
| 4,877,859 A | | 10/1989 | Tamaru et al. |
| 4,920,028 A | | 4/1990 | Lazarus et al. |

(Continued)

FOREIGN PATENT DOCUMENTS

| | | |
|---|---|---|
| GB | 1010754 A | 11/1965 |
| JP | 61-9420 A | 1/1986 |

(Continued)

OTHER PUBLICATIONS

B.S. Farah et al., "Perhalo Ketones. VII. Phenolic Derivatives of the Perhaloacetones," Journal of Organic Chemistry, vol. 30, Apr. 1965, pp. 1003-1005.

(Continued)

*Primary Examiner* — David Karst
(74) *Attorney, Agent, or Firm* — Crowell & Moring LLP

(57) ABSTRACT

Disclosed is a novolak resin containing a repeating unit represented by the general formula (1). $R^1$ is a hydrogen atom or an alkyl group which is $C_{1-4}$ straight-chain or $C_{3-4}$ branched-chain, and some or all hydrogen atoms in the alkyl group may be replaced with a fluorine atom; $R^2$ is a hydrogen atom, a phenyl group, an alkyl group which is $C_{1-10}$ straight-chain or $C_{3-10}$ branched-chain, or an alkyl group having a $C_{3-10}$ cyclic structure, and some or all hydrogen atoms in the phenyl group and the alkyl group may be replaced with fluorine atoms; each of a and b is independently an integer of 1-3, and these are defined as $2 \leq a+b \leq 4$; and d is an integer of 0-2. This novolak resin has high dissolution rate in the alkaline development solution in addition to the heat resisting property which is a property of phenolic resin.

7 Claims, No Drawings

(51) Int. Cl.
*C08L 61/06* (2006.01)
*H05K 3/28* (2006.01)

(56) References Cited

U.S. PATENT DOCUMENTS

| | | | |
|---|---|---|---|
| 5,006,443 A | 4/1991 | Mueller | |
| 5,130,409 A | 7/1992 | Lazarus et al. | |
| 2008/0003517 A1 | 1/2008 | Komoriya et al. | |
| 2011/0244188 A1 | 10/2011 | Komoriya et al. | |
| 2011/0245395 A1 | 10/2011 | Komoriya et al. | |

FOREIGN PATENT DOCUMENTS

| | | | | | |
|---|---|---|---|---|---|
| JP | 63-273619 A | 11/1988 | | | |
| JP | 2-84414 A | 3/1990 | | | |
| JP | 2002-107925 A | 4/2002 | | | |
| JP | 2004-315683 A | 11/2004 | | | |
| JP | 2005-232095 A | 9/2005 | | | |
| JP | 2008-204923 A | 9/2008 | | | |
| JP | 2010-163604 A | 7/2010 | | | |
| JP | 2010-164957 A | 7/2010 | | | |
| JP | 2010235501 A | * | 10/2010 | ............. | C07C 37/20 |
| JP | 2010235502 A | * | 10/2010 | ............. | C07C 37/20 |

OTHER PUBLICATIONS

International Search Report (PCT/ISA/210) dated Jan. 28, 2014 with English-language translation (five (5) pages).
Japanese-language Written Opinion (PCT/ISA/237) dated Jan. 28, 2014 (three (3) pages).

* cited by examiner

NOVOLAK RESIN CONTAINING HEXAFLUOROISOPROPANOL GROUP, METHOD FOR PRODUCING SAME, AND COMPOSITION OF SAME

TECHNICAL FIELD

The present invention relates to a novolak resin containing hexafluoroisopropanol group, a method for producing the same, and a composition of the same.

BACKGROUND OF THE INVENTION

Normally, a phenolic resin can be obtained by reacting phenol with an aldehyde compound in the presence of an acid catalyst or a base catalyst. In the presence of an acid catalyst, it is possible to obtain a thermoplastic novolak-type phenolic resin (hereinafter it may be referred to as "novolak resin") which has a main chain in which phenol lines up with methylene chains. On the other hand, in the presence of a base catalyst, it is possible to obtain a thermosetting resol-type phenolic resin (hereinafter it may be referred to as "resol resin") which has a hydroxymethyl group at its end. The novolak resin has been widely used as a binder, such as that of friction materials, general molding materials, laminated materials, shell mold, whetstones, casting materials and foaming materials, because of being strong and having an insulation property.

Furthermore, the novolak resin has been also used for photoresists and semiconductor sealing materials, etc. in the electronic material field.

For example, as a positive type photoresist, it is known to use a composition containing a novolak resin, which is soluble in an alkaline development solution, and a quinone diazide group such as naphthoquinone diazide. Furthermore, 2.38 mass % aqueous solution of tetramethyl ammonium hydroxide (hereinafter it may be referred to as "TMAH") which is an organoalkali is used in photolithography. Unless there is a proviso in the present description, "alkaline development solution" refers to this solution.

In photolithography, the above composition is alkali developable after exposure and shows a high resolving power. Therefore, the composition has been used for such as a manufacture of IC (Integrated Circuit), LSI (Large Scale Integration), etc., a manufacture of liquid crystal display (LCD), and a manufacture of photomask which is a printing original plate of a semiconductor. Furthermore, a novolak resin also having an excellent heat resisting property has been used for the plasma dry etching.

In LCD, picture element has been miniaturized and pixel width has been required to be at a several μm level with the progress of technology continuing from STN (Super-twisted Nematic) to TFT (Thin Film Transistor), so resist is required to have a sensitivity corresponding to instant level. Important properties of resist are having a good sensitivity as a resist, being excellent in resolution of a resist pattern after development patterning, adhesion with substrate, heat resisting property and circuit linewidth uniformity (CD uniformity), and having a high residual film rate.

Furthermore, it is also an important property that dissolution in the alkali development solution is fast, in other words, the rate of dissolution in the alkaline development solution (hereinafter it may be referred to as "Alkali Dissolution Rate") is large.

Because of having heat resisting property in these properties, as a resist a composition containing a novolak resin, which is soluble in an alkaline development solution, and a quinone diazide group such as naphthoquinone diazide has attracted attention.

Although there is an illustration of resist to improve heat resisting property, which has been considered with a use of alkylphenol such as xylenol and trimethylphenol, the improvement of heat resisting property was small. Furthermore, in case of raising softening point to improve heat resisting property by raising molecular weight, the raising molecular weight has caused a defect that sensitivity of resist decreases.

A resin obtained by making phenol, m-cresol, or p-cresol react with formaldehyde or a monohydroxy aromatic aldehyde is disclosed in Patent Publication 1 and Patent Publication 2. The resin is regarded as a phenolic resin for photoresist having all of high heat resisting property, high resolution and high sensitivity.

On the other hand, a composition containing an epoxy resin and a hardening agent is used as a semiconductor sealing material. Also, acid anhydride, phenolic resin, etc. are used as the hardening agents. Although a hardened material of an epoxy resin composition using an acid anhydride as the hardening agent has transparency, this hardened material is poor in heat resisting property, so its transparency is easy to deteriorate under a high temperature environment. Furthermore, there are a problem that desired moisture resistant property and storage stability can't be obtained, and other problems. Although an epoxy resin using phenolic resin as the hardening agent has heat resisting property and moisture resistant property, this epoxy resin has problems like coloring by oxidation in preservation of transparency.

As an epoxy resin composition having light transmission and moisture resistant property, a light-transmissive epoxy resin composition using a cyclic terpene skeleton-containing diphenol as the hardening agent is disclosed in Patent Publication 3.

In this way, a hardening agent to make epoxy resin have heat resisting property, moisture resistant property, and transparency in a good balance instead of spoiling these properties is required.

In Non-Patent Publication 1, a method for producing an alkoxy benzene containing a hexafluoroisopropanol group is disclosed.

PRIOR ART PUBLICATIONS

Patent Publications

Patent Publication 1: Japanese Patent Application Publication 2-84414
Patent Publication 2: Japanese Patent Application Publication 2002-107925
Patent Publication 3: Japanese Patent Application Publication 2004-315683

Non-Patent Publication

Non-Patent Publication 1: (The Journal of Organic Chemistry, 1965, 30, 1003-1005)

SUMMARY OF THE INVENTION

It is an object of the present invention to provide a novolak resin which has moisture resistant property and transparency in addition to heat resisting property which is a property of phenolic resin in a good balance, especially, whose alkali dissolution rate is large. Furthermore, it is an object of the present invention to provide a novolak resin having an effect that yellowing is suppressed in using the resin as a hardening agent against epoxy resins.

As means to solve the above problem, as a result of a keen examination, the present inventors made HFIP group-containing phenol or HFIP group-containing alkoxy benzene as a starting material, which contains hexafluoroisopropanol group (2-hydroxy-1,1,1,3,3,3-hexafluoroisopropyl group, $-C(CF_3)_2OH$, hereinafter it may be referred to as "HFIP group") react with aldehyde compounds for polymerization to obtain a novel HFIP group-containing novolak resin, thereby reaching the present invention. Polarity of the resin rises and becomes acid by introducing a HFIP group having polarity due to the polarization of OH group and F (fluorine) into a novolak resin, so that solubility of the resin in alkaline development solution rises. Therefore, it is possible to improve alkali dissolution rate.

Furthermore, in the present invention, phenol means a compound prepared by substituting a hydroxyl group for a hydrogen atom of an aromatic ring. Alkoxy benzene means a compound prepared by substituting an alkyl group for a hydrogen atom of hydroxyl group of phenol. Novolak resin means a resin which is synthesized from these phenol and aldehyde compounds or these alkoxy benzene and aldehyde compounds.

That is to say, the present invention comprises the following inventions 1-7.

[Invention 1]

A novolak resin containing a repeating unit represented by the general formula (1):

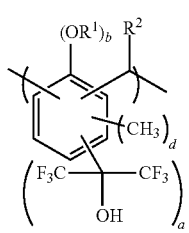

(1)

(In the formula, $R^1$ is a hydrogen atom or an alkyl group which is $C_{1-4}$ straight-chain or $C_{3-4}$ branched-chain, and a part of or all hydrogen atoms in the alkyl group may be replaced with a fluorine atom; $R^2$ is a hydrogen atom, a phenyl group, an alkyl group which is $C_{1-10}$ straight-chain or $C_{3-10}$ branched-chain, or an alkyl group having a $C_{3-10}$ cyclic structure, and a part of or all hydrogen atoms in the phenyl group and the alkyl group may be replaced with a fluorine atom; each of a and b is independently an integer of 1-3, and these are defined as $2 \leq a+b \leq 4$; and d is an integer of 0-2.).

[Invention 2]

The novolak resin of the Invention 1 containing a repeating unit represented by the general formula (2):

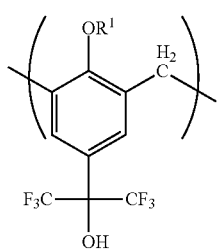

(2)

(In the formula, $R^1$ is a hydrogen atom or an alkyl group which is $C_{1-4}$ straight-chain or $C_{3-4}$ branched-chain, and a part of or all hydrogen atoms in the alkyl group may be replaced with a fluorine atom.).

[Invention 3]

A method for producing the novolak resin as described in the Invention 1, wherein a compound represented by the general formula (3)

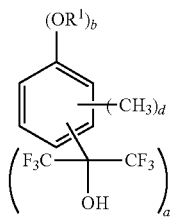

(3)

(In the formula, $R^1$ is a hydrogen atom or an alkyl group which is $C_{1-4}$ straight-chain or $C_{3-4}$ branched-chain, and a part of or all hydrogen atoms in the alkyl group may be replaced with a fluorine atom; each of a and b is independently an integer of 1-3, and these are defined as $2 \leq a+b \leq 4$; and d is an integer of 0-2.), is reacted with an aldehyde compound selected from an aldehyde compound represented by the general formula (4)

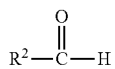

(4)

($R^2$ is a hydrogen atom, a phenyl group, an alkyl group which is $C_{1-10}$ straight-chain or $C_{3-10}$ branched-chain, or an alkyl group having a $C_{3-10}$ cyclic structure, and a part of or all hydrogen atoms in the phenyl group and the alkyl group may be replaced with a fluorine atom.) or a paraformaldehyde in the presence of an acid catalyst.

[Invention 4]

A method for producing the novolak resin as described in the Invention 2, wherein a compound represented by the general formula (5)

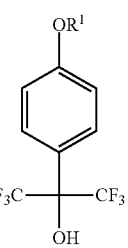

(5)

(In the formula, $R^1$ is a hydrogen atom or an alkyl group which is $C_{1-4}$ straight-chain or $C_{3-4}$ branched-chain, and a part of or all hydrogen atoms may be replaced with a fluorine atom.), is reacted with an aldehyde compound selected from an aldehyde compound represented by the general formula (4)

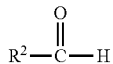
(4)

($R^2$ is a hydrogen atom, a phenyl group, an alkyl group which is $C_{1-10}$ straight-chain or $C_{3-10}$ branched-chain, or an alkyl group having a $C_{3-10}$ cyclic structure, and a part of or all hydrogen atoms in the phenyl group and the alkyl group may be replaced with a fluorine atom.) or a paraformaldehyde in the presence of an acid catalyst.

[Invention 5]

The method for producing the novolak resin of the Invention 3 or the Invention 4, wherein the aldehyde compound is formaldehyde or paraformaldehyde.

[Invention 6]

A composition comprising the novolak resin of the Invention 1, an epoxy resin and a solvent.

[Invention 7]

A hardened film obtained by hardening the composition of the Invention 6.

EFFECT OF THE INVENTION

In the present invention, a novel HFIP group-containing novolak resin prepared by introducing an HFIP group(s) into a novolak resin has been obtained. The HFIP group-containing novolak resin of the present invention has a characteristic that its alkali dissolution rate is large by making the novolak resin contain an HFIP group(s), in addition to heat resisting property a novolak resin has.

In case that the HFIP group-containing novolak resin of the present invention is used as a hardening agent, the novolak resin suppresses yellowing of epoxy resin and gives heat resisting property and transparency even under high temperatures.

DETAILED DESCRIPTION

1. HFIP Group-Containing Novolak Resin

The details about the HFIP group-containing novolak resin of the present invention are shown below.

The present invention is an HFIP group-containing novolak resin containing a repeating unit represented by the following general formula (1) (hereinafter it may be referred to as "HFIP group-containing novolak resin (1)").

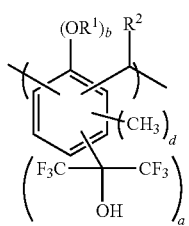
(1)

(In the formula, $R^1$ is a hydrogen atom or an alkyl group which is $C_{1-4}$ straight-chain or $C_{3-4}$ branched-chain, and a part of or all hydrogen atoms in the alkyl group may be replaced with fluorine atoms; $R^2$ is a hydrogen atom, a phenyl group, an alkyl group which is $C_{1-10}$ straight-chain or $C_{3-10}$ branched-chain, or an alkyl group having a $C_{3-10}$ cyclic structure, and a part of or all hydrogen atoms in the phenyl group and the alkyl group may be replaced with fluorine atoms; each of a and b is independently an integer of 1-3, and these are defined as 2≤a+b≤4; and d is an integer of 0-2.)

From the viewpoint of easiness of synthesis and easiness of acquisition of materials, it is preferable that $R^1$ in the formula (1) is a hydrogen atom or a methyl group. Furthermore, it is preferable that $R^2$ is a hydrogen atom. Furthermore, it is preferable that a is 1 or 2, and besides 1 is more preferable. It is preferable that b is 1.

As a repeating unit contained in the HFIP group-containing novolak resin (1), for example, it is possible to cite the following illustrations.

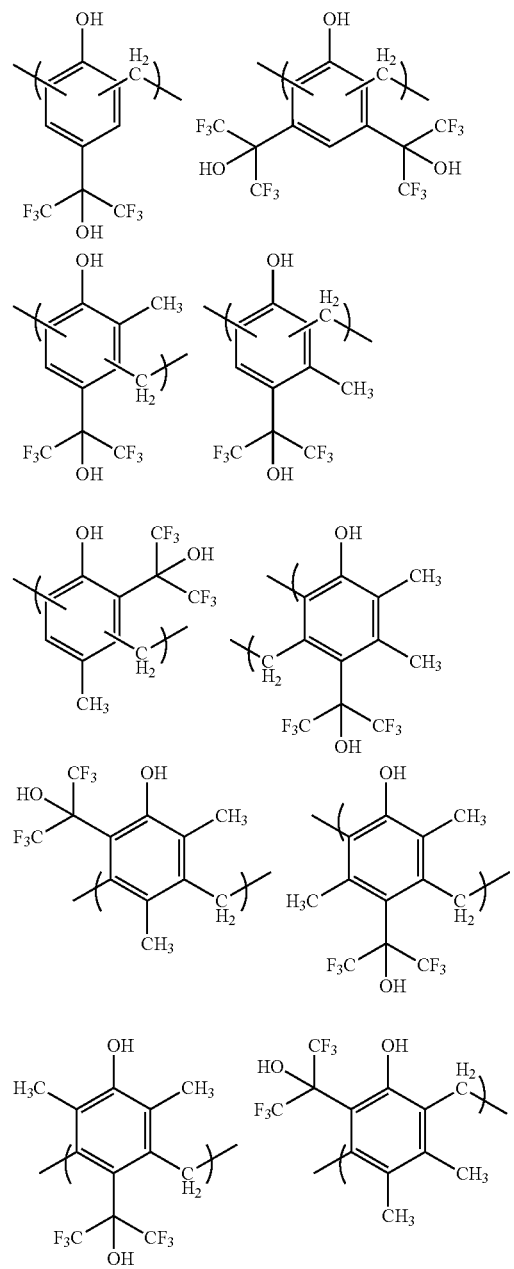

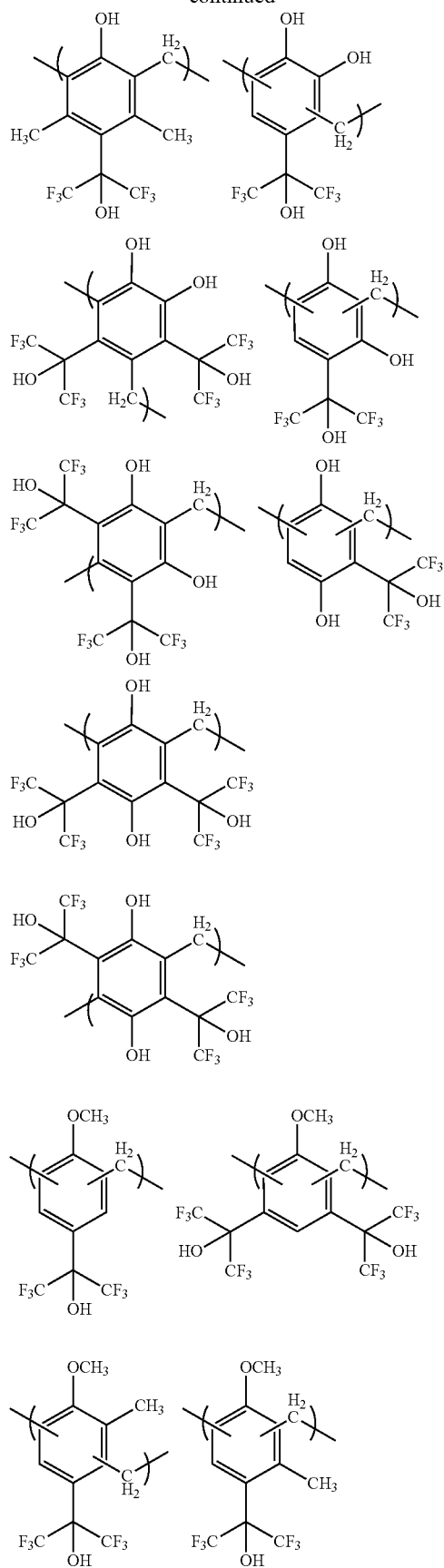
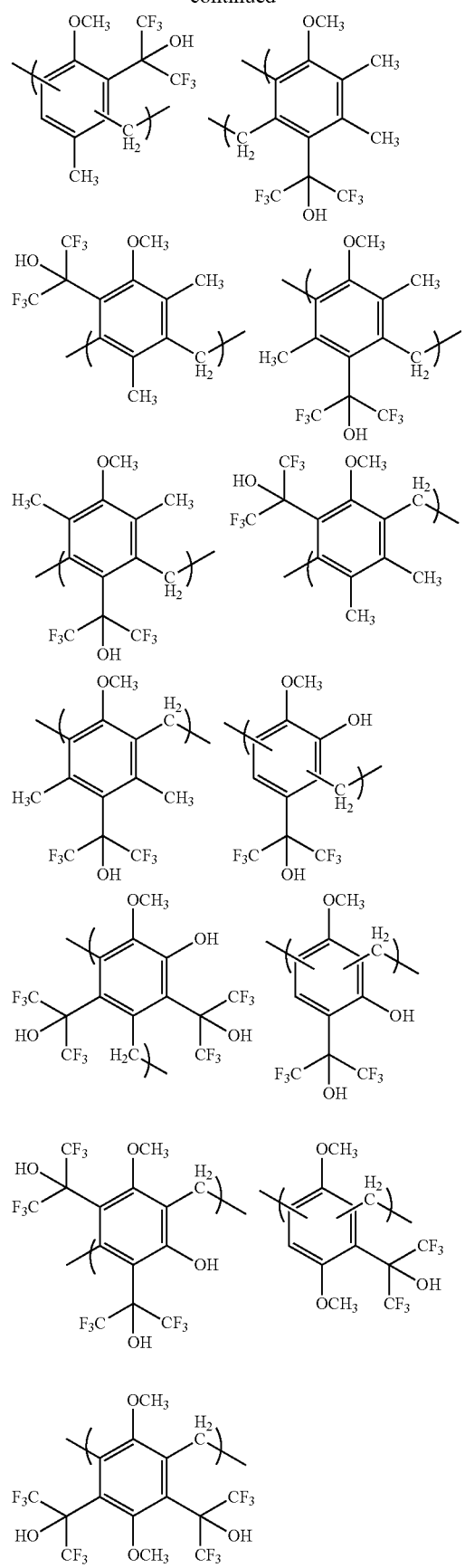

-continued

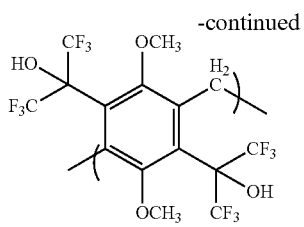

Furthermore, from the viewpoint of easiness of synthesis, it is preferable that the HFIP group-containing compound (1) is an HFIP group-containing compound containing a repeating unit represented by the following general formula (2) (hereinafter it may be referred to as "HFIP group-containing novolak resin (2)").

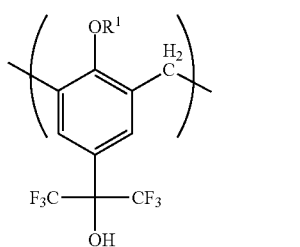

(2)

(In the formula, $R^1$ is a hydrogen atom or an alkyl group which is $C_{1-4}$ straight-chain or $C_{3-4}$ branched-chain, and a part of or all hydrogen atoms in the alkyl group may be replaced with fluorine atoms.)

As a repeating unit contained in the HFIP group-containing novolak resin (2), for example, it is possible to cite the following illustrations.

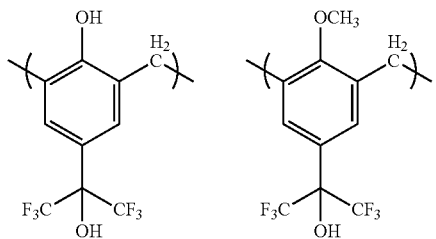

In the present invention, it is obtained that an HFIP group-containing novolak resin whose alkali dissolution rate is improved by introducing an HFIP group into a novolak resin which is hardly soluble in alkali (for example, TMAH).

The HFIP group-containing novolak resin (1) of the present invention can be used as a resist material because of being soluble in organic solvents and being able to be for a use in wet coating.

In case that weight-average molecular weight of resist material is large, generally, its alkali dissolution rate gets small, and the alkali dissolution time gets long in development. However, the HFIP group-containing novolak resin (1) of the present invention has the characteristic that, since the alkali dissolution rate is large by having an HFIP group(s) in the structure, the alkali dissolution time is short even if the weight-average molecular weight is large, that is, high molecular weight.

In photolithography, to be large in alkali dissolution rate of resist makes the patterning time short and leads to decreasing pattern defects unmelted residue causes. The HFIP group-containing novolak resin (1) of the present invention has the advantageous characteristic that the alkali dissolution time is short in using for a resist material as a resist material for producing liquid crystal display circuits and micro circuits of semiconductor integrated circuits.

Furthermore, since an HFIP group reacts with an epoxy group, an HFIP group-containing compound functions as a hardening agent of epoxy resins and provides the hardened epoxy resin with transparency and heat resisting property which leads to no yellowing even in use under high temperatures. Therefore, the HFIP group-containing novolak resin (1) can be used for producing coating materials for flat panel displays, protective films for substrate main bodies for electronic circuits or protective films for semiconductors, or semiconductor sealing materials.

Especially, in case that $R^1$ is a methyl group, there is an advantageous effect that transparency can be maintained, since a visible light absorbing double bond resulting from quinoidization of an aromatic ring in the HFIP group-containing novolak resin (1) is not generated by a heating operation such as resist baking.

2. A Method for Producing an HFIP Group-Containing Novolak Resin 2-1. HFIP Group-Containing Compound The HFIP group-containing novolak resin (1) of the present invention can be obtained by reacting an HFIP group-containing compound represented by the formula (3) (hereinafter it may be referred to as "HFIP group-containing compound (3)") with an aldehyde compound in the presence of an acid catalyst.

That is, the present invention is a method for producing the HFIP group-containing novolak resin (1) by reacting the HFIP group-containing compound (3) with an aldehyde compound in the presence of an acid catalyst. Furthermore, the HFIP group-containing compound (3) is a phenol derivative having one HFIP group or more.

Hereinafter, it is explained in order.

The HFIP group-containing compound (3), which is a raw material compound of the HFIP group-containing novolak resin (1) of the present invention, is an HFIP group-containing phenol or HFIP group-containing alkoxy benzene represented by the general formula (3).

The general formula (3):

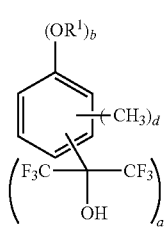

(3)

(In the formula, $R^1$ is a hydrogen atom or an alkyl group which is $C_{1-4}$ straight-chain or $C_{3-4}$ branched-chain, and a part of or all hydrogen atoms in the alkyl group may be replaced with fluorine atoms; each of a and b is independently an integer of 1-3, and these are defined as $2 \leq a+b \leq 4$; and d is an integer of 0-2.)

The HFIP group-containing compound (3), which is a raw material compound of the HFIP group-containing novolak resin (1) of the present invention, is a phenol derivative having one HFIP group or more. As shown in the following reaction formula, the HFIP group-containing compound (3) is polymerized with an aldehyde compound in the presence of an acid catalyst, thereby making the HFIP group-containing novolak resin (1) as a novolak resin.

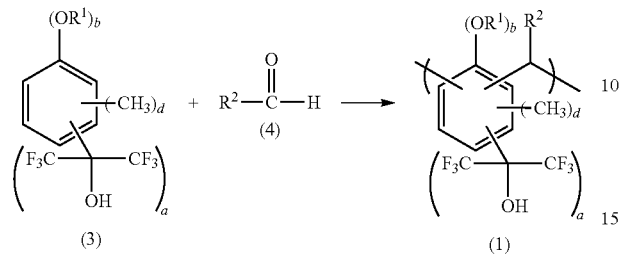

A phenol, which belongs in HFIP group-containing compound (3), can be synthesized by reacting a phenol, which is a raw material, with hexafluoroacetone ((CF3)$_2$C=O, hereinafter it may be referred to as "HFA") or hexafluoroacetone trihydrate in the presence of an acid catalyst. It can be exemplified by the following compounds.

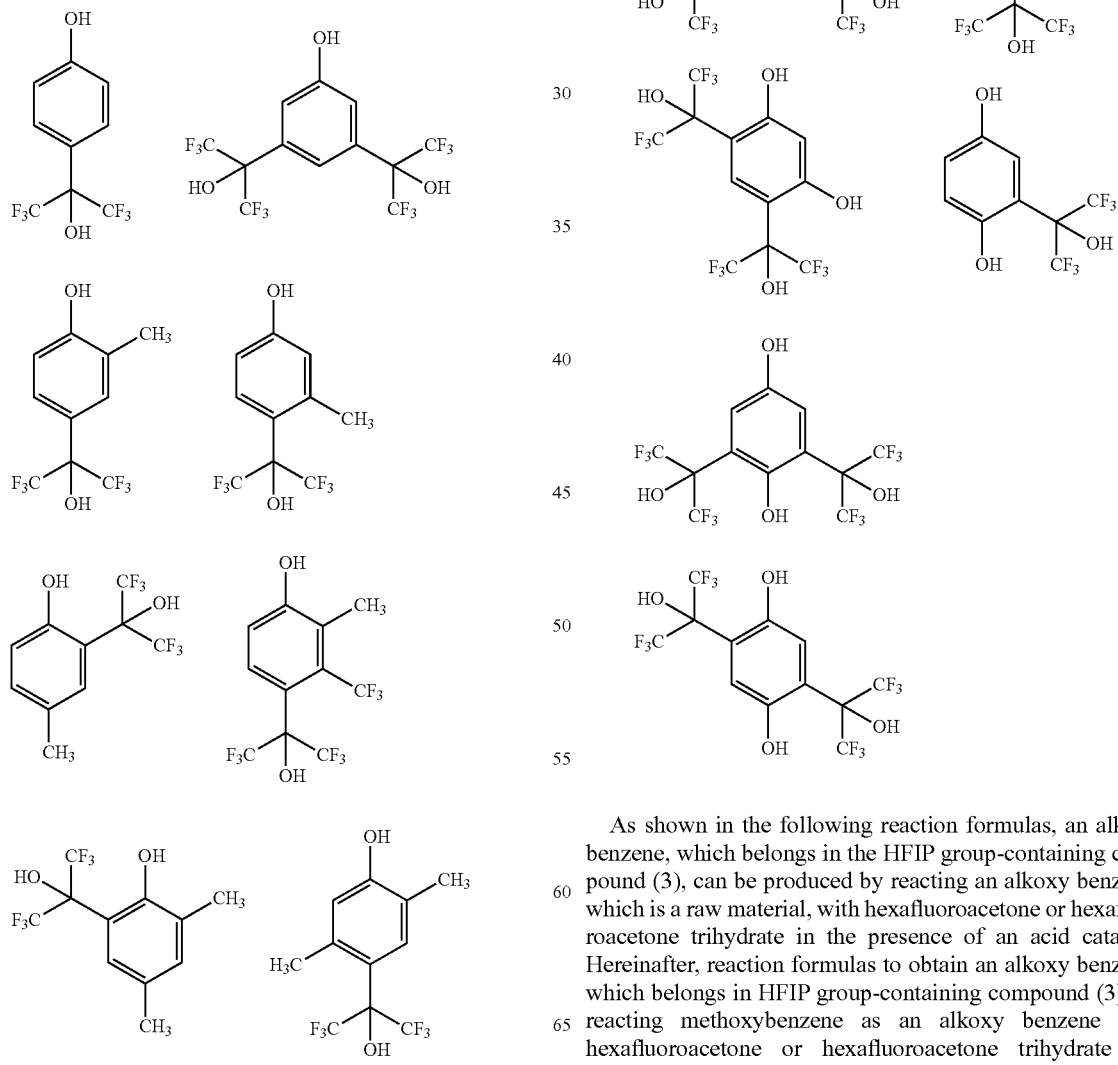

As shown in the following reaction formulas, an alkoxy benzene, which belongs in the HFIP group-containing compound (3), can be produced by reacting an alkoxy benzene, which is a raw material, with hexafluoroacetone or hexafluoroacetone trihydrate in the presence of an acid catalyst. Hereinafter, reaction formulas to obtain an alkoxy benzene, which belongs in HFIP group-containing compound (3), by reacting methoxybenzene as an alkoxy benzene with hexafluoroacetone or hexafluoroacetone trihydrate are shown.

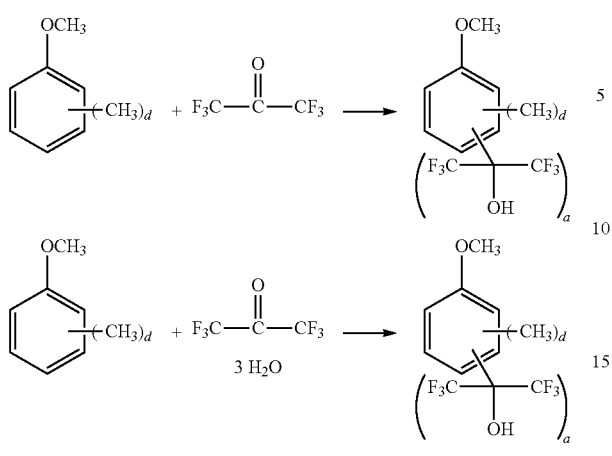

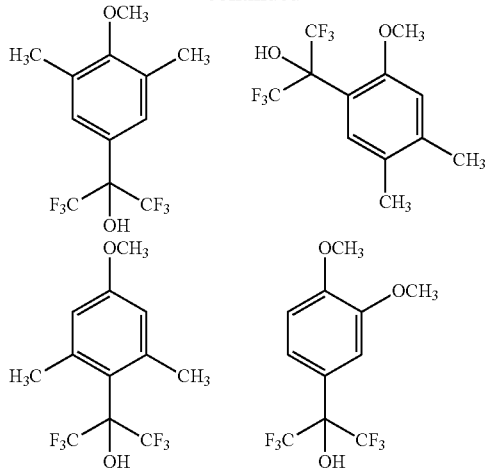

Furthermore, it can be synthesized by a metallization by reacting an alkoxybenzene with an organometallic reagent or by reacting a halogenated alkoxy benzene with an organometallic reagent to conduct a metal-halogen exchange reaction, followed by reacting with hexafluoroacetone.

The alkoxy benzene, which is the HFIP group-containing compound (3), is exemplified as follows.

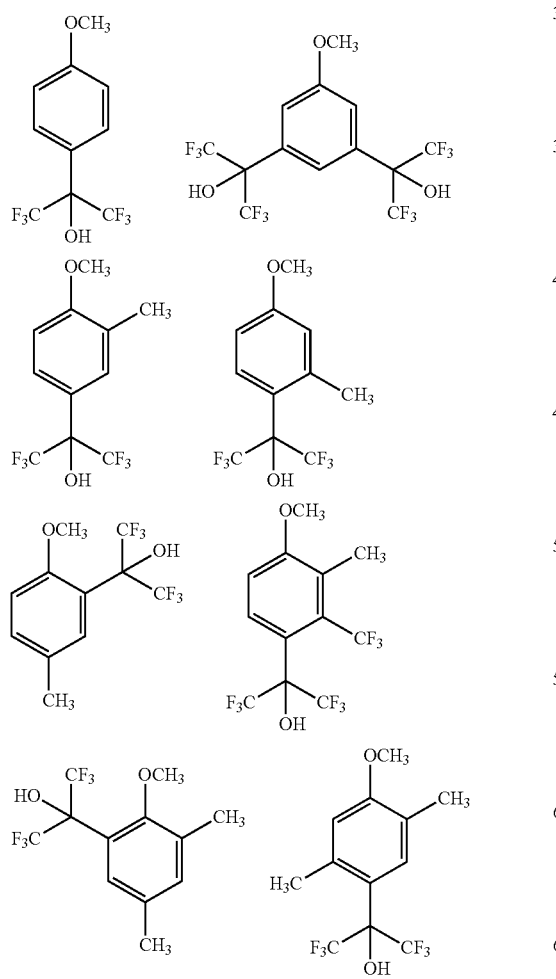

It is preferable that the HFIP group-containing compound (3) is a compound represented by the following formula (5) (hereinafter it may be referred to as "HFIP group-containing compound (5)") because of easiness to synthesize.

The General Formula (5)

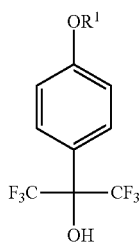

(5)

(In the formula, $R^1$ is a hydrogen atom or an alkyl group which is $C_{1-4}$ straight-chain or $C_{3-4}$ branched-chain, and a part of or all hydrogen atoms may be replaced with a fluorine atom.)

Specifically, it is possible to cite the following compounds as examples.

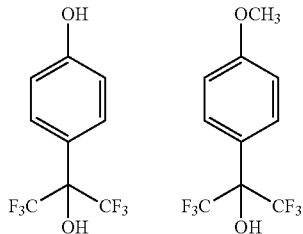 [SMILES: Oc1ccc(C(O)(C(F)(F)F)C(F)(F)F)cc1 ; COc1ccc(C(O)(C(F)(F)F)C(F)(F)F)cc1]

2-2. Aldehyde Compound

In producing an HFIP group-containing novolak resin (1) of the present invention, the aldehyde compound (4) to be reacted with an HFIP group-containing compound (3) in the presence of an acid catalyst is a $C_{1-6}$ aldehyde compound. Specifically, it is possible to cite formaldehyde, acetaldehyde, propionaldehyde, butyraldehyde, or benzaldehyde.

In the present invention, formaldehyde or paraformaldehyde, that is, $(CH_2O)_n$ is preferably used ("n" means polymerization degree). Specifically, the formaldehyde may be formalin which is a 37 mass % or greater aqueous solution of formaldehyde. Paraformaldehyde, that is, $(CH_2O)_n$ is a polymer which is formed by polymerization of formaldehyde and is represented by trioxane as trimer. The polymer is decomposed in the presence of an acid catalyst, and generates formaldehyde. Therefore, an HFIP group-containing novolak resin of the present invention is synthesized by reacting the generated formaldehyde with an HFIP compound (3).

2-3. Acid Catalyst

As the acid catalyst to be used, it suffices to act as a reaction catalyst. Specifically, it is possible to cite an inorganic acid such as hydrochloric acid, sulfuric acid, or polyphosphoric acid, and to cite an organic acid such as trifluoroacetic acid, p-toluenesulfonic acid, or trifluoromethanesulfonic acid. As an acid having high acidity is preferable, it is preferable to select hydrochloric acid, sulfuric acid, trifluoroacetic acid, or trifluoromethanesulfonic acid.

2-4. A Method for Producing an HFIP Group-Containing Novolak Resin

An HFIP group-containing novolak resin (1) of the present invention is obtained by carrying out a condensation polymerization reaction of an HFIP group-containing compound (3) and an aldehyde compound in the presence of an acid catalyst. An HFIP group-containing novolak resin (2) is obtained by carrying out a condensation polymerization reaction of an HFIP group-containing compound (5) and an aldehyde compound in the presence of an acid catalyst.

In that case, a monohydric phenol or a dihydric phenol which has no HFIP group, besides the HFIP group-containing compound (3) or the HFIP group-containing compound (5), can be used to adjust the weight-average molecular weight, the alkali dissolution rate and the active hydrogen equivalent.

Although such phenol is not particularly limited, specifically, it is possible to cite phenol, p-cresol, m-cresol, o-cresol, 2,3-xylenol, 2,4-xylenol, 2,5-xylenol, 2,6-xylenol, 3,4-xylenol, 3,5-xylenol, 2,3,5-trimethylphenol, 2,3,6-trimethylphenol, catechol, resorcinol, or hydroquinone.

In the method for producing an HFIP group-containing novolak resin of the present invention, it is possible to obtain a phenolic resin having the desired weight-average molecular weight by adjusting the molar ratio of the aldehyde compound used to all of the phenols, that is, the total of the HFIP group-containing compound (3) and the above phenol having no HFIP group, to 0.5 or more and 1.5 or less. A more preferable molar ratio of the aldehyde compound to be used is 0.6 or more and 1.2 or less.

A preferable weight-average molecular weight of the HFIP group-containing novolak resin of the present invention is 1,500 or more and 100,000 or less, and more preferably 2,000 or more and 6,000 or less. In case that the weight-average molecular weight is lower than 1,500, heat resisting property deteriorates. In case that the weight-average molecular weight is higher than 100,000, the novolak resin is hardly soluble in alkaline development solutions and organic solvents. Furthermore, in the present invention, the weight-average molecular weight is measured by gel permeation chromatography (GPC) using tetrahydrofuran as a solvent and is a value calculated in terms of polystyrene.

A method for producing an HFIP group-containing novolak resin of the present invention is conducted by a polycondensation reaction which is caused by putting the above HFIP group-containing compound, an aldehyde compound, an acid catalyst and a reaction solvent into a reactor vessel equipped with a stirring device, adding a phenol containing no HFIP group, etc. as necessary, and raising the temperature to a predetermined temperature.

The reaction solvent is preferably one that dissolves an HFIP group-containing compound (3) or an HFIP-containing compound (5). Accordingly, it is possible to cite organic acids, for instance, acetic acid, propionic acid, acetic anhydride, or trifluoroacetic acid, halogen-based solvents, for instance, chloroform, 1,2-dichloroethane, methylene chloride, carbon tetrachloride, or ortho-dichloroethane, aromatic hydrocarbon-based solvents, for instance, benzene, toluene, or xylene. These solvents may be used singly or by mixture.

It is not essential to use these solvents, and the reaction advances even if the reactant during the reaction is either a solid or a liquid. However, in general, it is possible to advance only the target reaction without having side reactions by making a uniform solution state by dissolving the reactant using a reaction solvent or a suspension state even if it is not dissolved.

Although the temperature at the polycondensation reaction differs according to the reaction solvent used, a temperature range of 0° C. or higher and 200° C. or lower can be applied. In case that the temperature is lower than 0° C., the polymerization reaction is hard to advance. In case that the temperature is higher than 200° C., the reaction control is hard. Therefore, it becomes difficult to stably obtain the objective HFIP group-containing novolak resin. Particularly preferably, it is 20° C. or higher and 140° C. or lower.

After the termination of the above reaction, the HFIP group-containing novolak resin can be obtained by carrying out operations, such as reprecipitation, washing, extraction, and solvent distillation, to remove the acid catalyst according to solubility of the HFIP group-containing novolak resin obtained or the kind of the reaction solvent used, followed by dehydrating under ordinary pressure and reduced pressure.

3. A Composition Containing an HFIP Group-Containing Novolak Resin and an Epoxy Resin Next, an epoxy resin composition containing an HFIP group-containing novolak resin (1) or an HFIP group-containing novolak resin (2) of the present invention and an epoxy resin is described.

The HFIP group-containing novolak resin (1) or the HFIP group-containing novolak resin (2), which is the HFIP group-containing novolak resin of the present invention, has in the molecule an HFIP group and a phenolic hydroxyl group, which is a hydroxyl group directly bonded to the aromatic ring. By mixing the novolak resin with an epoxy resin and heating them, the epoxy resin is reacted with the HFIP group or the hydroxyl group directly bonded to the aromatic ring. Thereby, a hardened material can also be obtained.

[Epoxy Resin]

It suffices that the epoxy resin is of a structure having at least two epoxy groups within its molecule.

For example, it is possible to cite bisphenol A-type epoxy resin, biphenyl-type epoxy resin, aminophenol-type epoxy resin, tetramethyl bisphenol F-type epoxy resin, hydroquinone-type epoxy resin, phenol novolak-type epoxy resin, bisphenol S-type epoxy resin, naphthalenediol-type epoxy resin, β-naphthol aralkyl-type epoxy resin, naphthol aralkyl-type epoxy resin, α-naphthol aralkyl-type epoxy resin, an epoxy resin which is produced from an amine compound, such as aminodiphenylmethanetetraglycidylamine, and epihalohydrin, a phosphorus-containing epoxy resin, bisthioether-type epoxy resin, resorcinol-type epoxy resin, alkylene glycol-type epoxy resin, trisphenylmethane-type epoxy resin, trisphenylmethane-type epoxy resin, resorcinol-type epoxy resin, dicyclopentadiene-type epoxy resin, an urethane modified epoxy resin, or an oxazolidone ring-containing epoxy resin.

Commercial products can be used as these epoxy resins. It is possible to cite, for example, product name: jER-827 or jER-828 which is a bisphenol A-type epoxy resin, product name: jER YX4000H which is a biphenyl-type epoxy resin, and product name: jER630 which is an aminophenol-type epoxy resin, which are produced by Mitsubishi Chemical Corporation, for example, product name: Epotohto YDF-170 or Epotohto YDF-8170 which is a bisphenol A-type epoxy resin, product name: YSLV-80XY which is a tetramethyl bisphenol F-type epoxy resin, product name: Epotohto YDC-1312 which is a hydroquinone-type epoxy resin, product name: Epotohto YDPN-638 which is a phenol novolak-type epoxy resin, product name: Epotohto YDCN-701 which is a cresol novolak-type epoxy resin, product name: Epotohto ZX-1201 which is a bisphenolfluorene-type epoxy resin, product name: Epotohto TX-0710 which is a bisphenol S-type epoxy resin, product names: Epotohto ZX-1355 and Epotohto ZX-1711 which are naphthalenediol-type epoxy resins, product name: Epotohto ESN-155 which is a β-naphthol aralkyl-type epoxy resin, product names: Epotohto ESN-355 and Epotohto ESN-375 which are naphthol aralkyl-type epoxy resins, product names: Epotohto ESN475V and Epotohto ESN-485 which are α-naphthol aralkyl-type epoxy resins, product name: Epotohto YH-434 which is an epoxy resin produced from an amine compound, such as diaminodiphenylmethanetetraglycidylamine, and epihalohydrin, product names: Epotohto FX-289B, Epotohto FX-305 and TX-0932A which are phosphorus-containing epoxy resins obtained by reacting an epoxy resin, such as a phosphorus-containing epoxy resin, with a modifier, such as a phosphorus-containing phenol compound, product name: YSLV-120TE which is a bisthioether-type epoxy resin, product name: Epotohto ZX-1684 which is a resorcinol-type epoxy resin, product names: TX-0929 and TX-0934 which are alkylene glycol-type epoxy resins, which are produced by Nippon Steel Chemical Co., Ltd., product name: EPPN-501H which is a trisphenylmethane-type epoxy resin produced by Nippon Kayaku Co., Ltd., product name: TMH-574 which is a trisphenylmethane-type epoxy resin produced from a phenol compound of a polyhydric phenolic resin and epihalohydrin, which is produced by Sumitomo Chemical Company, Limited, Denacol EX-201 which is a resorcinol-type epoxy resin produced by Nagase ChemteX Corporation, or product name: Epiclon HP-7200H which is a dicyclopentadiene-type epoxy resin produced by DIC Corporation. It is possible to use equivalents to these commercial products.

[Hardening Accelerator]

In hardening a composition containing an HFIP group-containing novolak resin and an epoxy resin, a hardening accelerator may be added and a well-known one can be used. For example, it is possible to cite tertiary amines, quaternary ammonium salts, imidazoles, organophosphine compounds, or quaternary phosphonium salts.

Specifically, as the tertiary amine, it is possible to cite, for example, triethylamine, triethylenediamine, benzyldimethylamine, 2,4,6-tris(dimethylaminomethyl)phenol, or 1,8-diazabicyclo[5,4,0]undec-7-ene. As the imidazole, it is possible to cite, for example, imidazole, 2-methylimidazole, 2,4-dimethylimidazole, 2-ethyl-4-methylimidazole, 2-phenylimidazole, or 2-phenyl-4-methylimidazole. As the organophosphine compound, it is possible to cite, for example, triphenylphosphine, tributylphosphine, tri(p-methylphenyl)phosphine, or tri(nonylphenyl)phosphine. As the quaternary phosphonium salt, it is possible to cite, for example, tetraphenylphosphonium tetraphenylborate, tetraphenylphosphonium tetraphenoxyborate, tetraphenylphosphonium-tetrabenzoic acid borate, or tetraphenylphosphonium tetranaphthoic acid borate.

[Compounding Ratio]

In a composition of the present invention containing an HFIP group-containing novolak resin and an epoxy resin, when the compounding ratio of the HFIP group-containing novolak resin and the epoxy resin is represented as molar ratio to the whole amount of the phenolic hydroxyl group and the HFIP group in the HFIP group-containing novolak resin, it is preferable that the epoxy group is 0.5 or more and 1.5 or less. More preferably, it is 0.8 or more and 1.2 or less. When a hardening accelerator is represented as mass ratio to the mass of the HFIP group-containing novolak resin, 0.1% or more and 5% or less is preferable.

[Solvent]

A solvent according to the present invention may, as an organic solvent, be one in which the composition can be dissolved. As amide-based solvent, it is possible to cite N,N-dimethylformamide, N,N-dimethylacetamide, N-methylformamide, hexamethylphosphoric triamide, or N-methyl-2-pyrrolidone. As other solvents, it is possible to cite cyclohexanone, propylene glycol monomethyl ether acetate (hereinafter it may be referred to as "PGMEA"), or γ-butyrolactone. However, it is not limited to these.

4. A Hardened Film Containing a Composition

A composition containing the HFIP group-containing novolak resin and the epoxy resin is dissolved in an organic solvent, and it is applied on a base body such as a glass substrate or a silicon substrate. Thereafter, it is crosslinked and hardened by heating, so a hardened film can be formed. In the hardening of the composition of the present invention containing an HFIP group-containing novolak resin and an epoxy resin, the HFIP group-containing novolak resin effectively operates as a hardening agent of the epoxy resin.

Although the concentration when the composition is dissolved in the above organic solvent is not especially limited, that the mass proportion of the composition is 5 mass % or more and 50 mass % or less is preferable. More preferably, it is 10 mass % or more and 40 mass % or less. Among them, in preparing the hardened film, the higher the concentration, the thicker film can be prepared.

As the method of the above application, there is especially no limitation. It is possible to suitably select the method according to the purpose. For example, it is possible to cite the method in which the composition dissolved in an organic solvent is directly applied on the above supporting body by means of such as a spin coater, a slit spin coater, a roll coater, a die coater, or a curtain coater.

Although the heating temperature (hardening temperature) in hardening is not especially limited, 45-220° C. is preferable and besides 100-200° C. is more preferable. Furthermore, although the heating time (hardening time) in hardening is not especially limited, 30-600 minutes is preferable and besides 60-480 minutes is more preferable. In case that the hardening temperature and the hardening time are lower than the lower limits of the above ranges, the hardening becomes not enough. Conversely, in case that these are higher than upper limits, decomposition of the resin component occurs in some cases, so either case is not preferable. Although the hardening condition depends on various conditions, it can be adjusted accordingly by such as making the hardening time short in raising the hardening temperature or making the hardening time long in lowering the hardening temperature.

As the HFIP group-containing novolak resin of the present invention has heat resisting property, a hardened material of the epoxy resin hardened by using the HFIP group-containing novolak resin as a hardening agent also has heat resisting property. A hardened material having transparency can be also obtained by using the HFIP group-containing novolak resin.

A composition of the present invention containing the HFIP group-containing novolak resin and the epoxy resin can be made into a hardened film after applying it on a base body, that is, it can be made into a hardened film after wet film formation. The hardened film is useful as a protective material for a substrate for FPDs and electronic circuits or a semiconductor sealing material.

EXAMPLES

Although hereinafter the present invention is more concretely described by citing examples, it does not mean that the present invention is limited to the examples.

1. The Synthesis of the HFIP Group-Containing Compound and the Evaluation of the Heat Resisting Property and Alkali Dissolution Rate

[Method for Measuring Weight-Average Molecular Weights and NMR Spectra]

The method for measuring weight-average molecular weights of the HFIP group-containing novolak resins and for measuring NMR (Nuclear Magnetic Resonance) spectra is shown in Table 1.

TABLE 1

| | |
|---|---|
| Measurement of the weight-average molecular weights | The weight-average molecular weights in terms of polystyrene were calculated using tetrahydrofuran (THF) as a solvent and HLC-8320GPC which is a gel permeation chromatography (GPC) device made by Tosoh Corporation. |
| NMR (Nuclear Magnetic Resonance) measurement | $^1$H-NMR and $^{19}$F-NMR were measured by using a nuclear magnetic resonance device of resonance frequency of 400 MHz (made by JEOL Ltd.). |

[The Synthesis of the HFIP Group-Containing Novolak Resin]

Example 1

5.20 g (0.02 mol) of 4-(1,1,1,3,3,3-Hexafluoro-2-hydroxypropan-2-yl)phenol as the HFIP group-containing novolak resin (5A), 0.60 g (0.02 mol) of paraformaldehyde, and 10 g of acetic acid as a solvent were put into a reactor vessel equipped with a stirring device, and they were mixed under room temperature (hereinafter it means about 20° C.). Next, the temperature was raised slowly with 2.76 g of concentrated sulfuric acid as an acid catalyst being dropped gradually under room temperature, and the following polycondensation reaction was carried out with stirring at 60° C. for 5 hours.

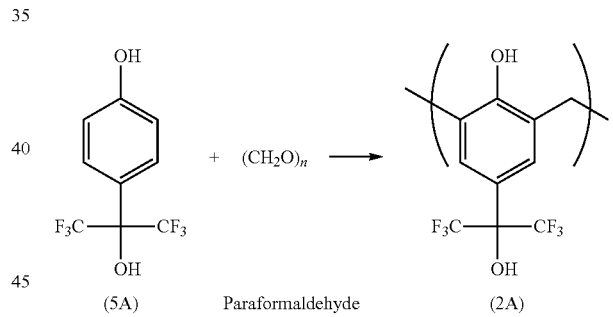

(5A)    Paraformaldehyde    (2A)

"n" is a positive integer.

After returning the reaction liquid to room temperature after the end of the reaction, an HFIP group-containing novolak resin (2A) containing a repeating unit represented by the formula (2A) was deposited by gradually pouring the above reaction liquid into a large beaker containing 200 g of distilled water. After filtering out the HFIP group-containing novolak resin (2A), dispersion washing with 200 g of distilled water was carried out, and it was filtered out again. Then, 5.0 g of the HFIP group-containing novolak resin (2A) as a polycondensate was obtained with a yield of 90% by drying up at 50° C. for 10 hours under reduced pressure in a vacuum dryer. Hereinafter the measurement results of weight-average molecular weight and NMR of the obtained HFIP group-containing novolak resin (2A) are shown.

Weight-average molecular weight (Mw)=2,600

1H-NMR (solvent, acetone-d6, TMS): δ7.37-7.59 (2H, m), 4.07 (2H,s)

19F-NMR (solvent, acetone-d6, CCl$_3$F): δ-74.5 (6F,s)

Example 2

10.96 g (0.04 mol) of 4-(1,1,1,3,3,3-Hexafluoro-2-hydroxypropan-2-yl)anisole as the HFIP group-containing novolak resin (5 B), 1.20 g (0.04 mol) of paraformaldehyde, and 60 g of trifluoroacetic acid as a solvent were put into a reactor vessel equipped with a stirring device, and they were mixed under room temperature. Next, the temperature was raised slowly with 7.36 g of concentrated sulfuric acid as an acid catalyst being dropped gradually under room temperature, and the following polycondensation reaction was carried out with stirring at 60° C. for 5 hours.

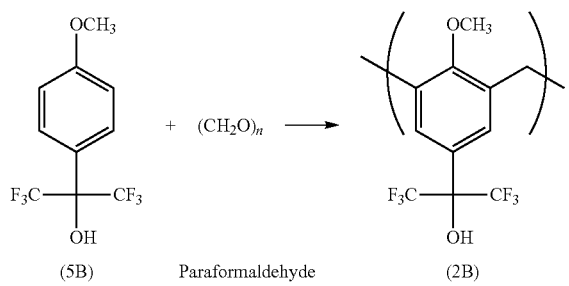

After the end of the reaction, 10.2 g of the HFIP group-containing novolak resin (2B) containing a repeating unit represented by the formula (2B) was obtained with a yield of 98% by carrying out the same operation as Example 1. Hereinafter the measurement results of weight-average molecular weight and NMR of the obtained HFIP group-containing novolak resin (2B) are shown.

Weight-average molecular weight (Mw)=42,000

1H-NMR (solvent, acetone-d6, TMS): δ7.41 (2H,s), 4.21 (2H,s), 3.64 (3H,s)

19F-NMR (solvent, acetone-d6, CCl$_3$F): δ-74.6 (6F,s)

Comparative Example 1

After putting 6.00 g (0.055 mol) of metacresol and 4.00 g (0.037 mol) of paracresol into a reactor vessel equipped with a stirring device at room temperature, it was raised up to 100° C. Next, after gradually dropping 5.00 g of formalin (the molar ratio to phenol which was the total of m-cresol and p-cresol was 0.675) which had a formaldehyde concentration of 37 mass % while keeping the reaction vessel inside temperature at 97-103° C., a reflux reaction was conducted for two hours. Afterwards, the inside temperature was raised to 150° C. under the atmospheric pressure to achieve dehydration. Next, the reaction vessel inside temperature was raised to 200° C. under a reduced pressure of 75 mmHg to achieve dehydration and to remove the monomers, and then 7.91 g of the novolak resin was obtained. Hereinafter, the measurement result of weight-average molecular weight of the obtained novolak resin is shown.

Weight-average molecular weight (Mw)=4,200

[Evaluation of the Heat Resisting Property and Alkali Dissolution Rate of the HFIP Group-Containing Novolak Resin]

Each of the weight-average molecular weights, the 5% mass reduction temperatures (° C.), and the alkali dissolution rates of the HFIP group-containing novolak resin (2A) obtained from Example 1, the HFIP group-containing novolak resin (2B) obtained from Example 2, and the novolak resin obtained from Comparative Example 1 was measured. The results were shown in Table 2.

Hereinafter, methods for measuring the heat resisting property and the alkali dissolution rate are shown.

<Measurement of the Heat Resisting Property>

The 5% mass reduction temperatures of the HFIP group-containing novolak resin (2A) obtained from Example 1, the HFIP group-containing novolak resin (2B) obtained from Example 2, and the novolak resin obtained from Comparative Example 1 were measured by using the thermal gravimetric-differential thermal analyzer (made by Rigaku Corporation, model number: TG8120) heating them from 30° C. to 500° C. at a temperature increase rate of 10° C./min in airflow.

<Measurement of the Alkali Dissolution Rate>

The HFIP group-containing novolak resin (2A) obtained from Example 1, the HFIP group-containing novolak resin (2B) obtained from Example 2, and the novolak resin obtained from Comparative Example 1 were dissolved in propylene glycol monomethyl ether acetate (PGMEA). Next, they were filtered by a membrane filter of a size 0.2 μm in diameter. Next, they were applied on a 4-inch silicon wafer using a spin coater so that the thickness was 3 μtm, and then they were made into coating films by drying on a hot plate at 110° C. for 60 minutes. Next, the time until the film completely disappeared was measured using the alkaline development solution (2.38 mass % aqueous solution of tetramethyl ammonium hydroxide). The value obtained by dividing the film thickness by the time until dissolution was defined as alkali dissolution rate.

TABLE 2

|  | Example 1 HFIP group-containing novolak resin (2A) | Example 2 HFIP group-containing novolak resin (2B) | Comparative Example 1 Novolak resin |
| --- | --- | --- | --- |
| Weight-average molecular weight | 2,600 | 42,000 | 4,200 |
| 5% mass reduction temperature (° C.) | 389 | 344 | 347 |
| Alkali dissolution rate (nm/sec) | 300 | 450 | 110 |

As shown in Table 2, although 5% mass reduction temperatures of the HFIP group-containing novolak resin (2A) and the HFIP group-containing novolak resin (2B) of the present invention, and the novolak resin obtained from Comparative Example 1 are roughly equal, their alkali dissolution rates are more than twice that of the novolak resin obtained from Comparative Example 1. It has been found that the HFIP group-containing novolak resin (2A) and the HFIP group-containing novolak resin (2B) of the present invention are equipped with a preferable property that the alkali dissolution rate is large in addition to the heat resisting property as a resist material.

2. A Composition Including an HFIP Group-Containing Novolak Resin and an Epoxy Resin

[Synthesis of the Composition and Film Formation of a Hardened Film]

Example 3

A bisphenol-type epoxy resin (made by Mitsubishi Chemical Corporation, product name: jER-828, epoxy equivalent of 190 g/ieq) and triphenylphosphine were mixed into the HFIP group-containing novolak resin (2A) obtained from Example 1 with the mass ratio shown in Table 3, and it was dissolved in PGMEA to make a solution of 30 mass %. By subjecting the obtained solution to spin coating on a glass substrate and by drying under heating it in an oven at 200° C. for 60 minutes, a hardened film whose film thickness was 2 μm was obtained.

Example 4

A hardened film was obtained in the same way as Example 3 using the HFIP group-containing novolak resin (2B) obtained from Example 2, the bisphenol-type epoxy resin (made by Mitsubishi Chemical Corporation, product name: jER-828, epoxy equivalent of 190 g/eq), and triphenylphosphine as a hardening accelerator.

Comparative Example 2

A hardened film was obtained in the same way as Example 3 using the novolak resin obtained from Comparative Example 1, the bisphenol-type epoxy resin (made by Mitsubishi Chemical Corporation, product name: jER-828, epoxy equivalent of 190 g/eq), and triphenylphosphine as a hardening accelerator.

Comparative Example 3

A hardened film was obtained in the same way as Example 3 using methyltetrahydrophthalic anhydride, the bisphenol-type epoxy resin (made by Mitsubishi Chemical Corporation, product name: jER-828, epoxy equivalent of 190 g/eq), and triphenylphosphine as a hardening accelerator.

Hereinafter, the mass proportions of the compounds used in Examples 3-4 and Comparative Examples 2-3 are shown.

TABLE 3

|  | Example 3 | Example 4 | Comparative Example 2 | Comparative Example 3 |
|---|---|---|---|---|
| HFIP group-containing polymer compound (2A) | 71 | — | — | — |
| HFIP group-containing polymer compound (2B) | — | 150 | — | — |
| Novolak resin (Comparative Example 1) | — | — | 63 | — |
| Methyltetrahydrophthalic anhydride | — | — | — | 88 |
| Bisphenol-type epoxy resin | 100 | 100 | 100 | 100 |
| Hardening agent (triphenylphosphine) | 2 | 2 | 2 | 2 |

[Evaluation of the Hardened Films]

Films formed by heating and hardening the compositions containing the HFIP group-containing novolak resin and the epoxy resin of Examples 3 and 4 included in the category of the present invention and films formed by heating and hardening the compositions of Comparative Examples 2 and 3 not included in the category of the present invention were evaluated. Hereinafter the evaluation method is shown.

<Light Transmittance>

The light transmittances in wavelength 400 nm of the hardened films obtained from Examples 3-4 and Comparative Examples 2-3 were measured by using an ultraviolet and visible spectrophotometer (made by Shimadzu Corporation, model number: UV-3150).

<Light Transmittance After Heat Resistance Test>

The light transmittances in wavelength 400 nm after leaving at 150° C. for 168 hours were measured by using the hardened films obtained from Examples 3-4 and Comparative Examples 2-3.

<5% Mass Reduction Temperature>

The hardened films obtained from Examples 3-4 and Comparative Examples 2-3 were shaved off from the glass substrates, and 5% mass reduction temperature was measured by using a thermal gravimetric-differential thermal analyzer (made by Rigaku Corporation, model number: TG8120) by heating them from 30° C. to 500° C. at a temperature increase rate of 10° C./min under a flow of dry air.

<Moisture Resistant Property>

The conditions of the hardened films after leaving for 168 hours under the condition of 85° C. and 85% RH were visually observed using the hardened films obtained from Examples 3-4 and Comparative Examples 2-3.

The evaluation results of the above light transmittance, light transmittance after heat resistance test, 5% mass reduction temperature, and moisture resistant property are shown in Table 4.

TABLE 4

|  | Example 3 | Example 4 | Comparative Example 2 | Comparative Example 3 |
|---|---|---|---|---|
| Light transmittance (%) | 99 | 98 | 63 | 99 |
| Light transmittance after heat resistance test (%) | 84 | 95 | 20 | 97 |
| 5% mass reduction temperature (° C.) | 306 | 324 | 312 | 301 |
| Moisture resistant property | unchanged | unchanged | unchanged | peeled off |

As shown in Table 4, the films formed by hardening the compositions of Examples 3 and 4 of the present invention have transparency because the light transmittances are high. Furthermore, the films have heat resisting property because the light transmittances after heat resistance test are high.

In particular, the hardened material of Example 4 using an HFIP group-containing novolak resin having a structure with —OCH$_3$ added to its aromatic ring kept 95% in light transmittance even after heat resistance test. It is considered that the reason of this matter is that the transparency could be maintained without generating a double bond having an absorbing property for visible light by quinoidization of the aromatic ring.

Furthermore, the hardened materials of Examples 3-4 were equipped with these useful properties as a protective film for semiconductors, such as enough 5% mass reduction temperature and moisture resistant property. In contrast, the film formed by hardening the composition of Comparative Example 2 has no transparency, and the film formed by hardening the composition of Comparative Example 3 has no moisture resistant property.

The invention claimed is:

1. A novolak resin containing a repeating unit represented by the general formula (1):

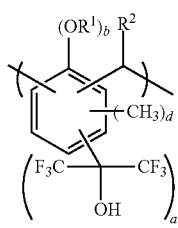
(1)

wherein $R^1$ is a hydrogen atom or an alkyl group which is $C_{1-4}$ straight-chain or $C_{3-4}$ branched-chain, and a part of or all hydrogen atoms in the alkyl group may be replaced with a fluorine atom; $R^2$ is a hydrogen atom, a phenyl group, an alkyl group which is $C_{1-10}$ straight-chain or $C_{3-10}$ branched-chain, or an alkyl group having a $C_{3-10}$ cyclic structure, and a part of or all hydrogen atoms in the phenyl group and the alkyl group may be replaced with a fluorine atom; each of a and b is independently an integer of 1-3, and these are defined as $2 \leq a+b \leq 4$; and d is an integer of 0-2.

2. A novolak resin as claimed in claim 1, containing a repeating unit represented by the general formula (2):

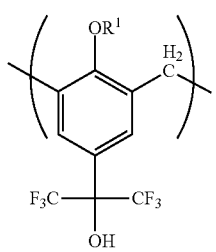
(2)

wherein $R^1$ is a hydrogen atom or an alkyl group which is $C_{1-4}$ straight-chain or $C_{3-4}$ branched-chain, and a part of or all hydrogen atoms in the alkyl group may be replaced with a fluorine atom.

3. A method for producing the novolak resin as claimed in claim 1, wherein a compound represented by the general formula (3)

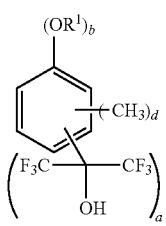
(3)

is reacted with an aldehyde compound selected from the group consisting of an aldehyde compound represented by the general formula (4)

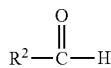
(4)

and a paraformaldehyde, in the presence of an acid catalyst;

wherein $R^1$ is a hydrogen atom or an alkyl group which is $C_{1-4}$ straight-chain or $C_{3-4}$ branched-chain, and a part of or all hydrogen atoms in the alkyl group may be replaced with a fluorine atom; each of a and b is independently an integer of 1-3, and these are defined as $2 \leq a+b \leq 4$; d is an integer of 0-2; and $R^2$ is a hydrogen atom, a phenyl group, an alkyl group which is $C_{1-10}$ straight-chain or $C_{3-10}$ branched-chain, or an alkyl group having a $C_{3-10}$ cyclic structure, a part of or all hydrogen atoms in the phenyl group and the alkyl group may be replaced with a fluorine atom.

4. A method for producing the novolak resin as claimed in claim 3, wherein the compound represented by the general formula (3) is a compound represented by the general formula (5)

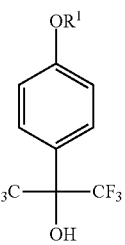
(5)

wherein $R^1$ is a hydrogen atom or an alkyl group which is $C_{1-4}$ straight-chain or $C_{3-4}$ branched-chain, and a part of or all hydrogen atoms in the alkyl group may be replaced with a fluorine atom.

5. A method for producing the novolak resin as claimed in claim 3, wherein the aldehyde compound is formaldehyde or paraformaldehyde.

6. A composition comprising the novolak resin as claimed in claim 1, an epoxy resin and a solvent.

7. A hardened film obtained by hardening the composition as claimed in claim 6.

* * * * *